United States Patent
Ohnishi et al.

(10) Patent No.: US 8,717,066 B2
(45) Date of Patent: May 6, 2014

(54) CLOCK DIAGNOSIS CIRCUIT

(75) Inventors: Naoya Ohnishi, Tokyo (JP); Hiroshi Nakatani, Tokyo (JP); Yoshito Sameda, Kanagawa-ken (JP); Jun Takehara, Tokyo (JP); Makoto Toko, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 13/614,235

(22) Filed: Sep. 13, 2012

(65) Prior Publication Data

US 2013/0082739 A1   Apr. 4, 2013

(30) Foreign Application Priority Data

Sep. 29, 2011  (JP) ................ P2011-215708

(51) Int. Cl.
*H03K 5/22*  (2006.01)
(52) U.S. Cl.
USPC .............................. 327/34; 327/20
(58) Field of Classification Search
None
See application file for complete search history.

(56) References Cited

U.S. PATENT DOCUMENTS

| 4,988,901 | A  | * | 1/1991 | Kamuro et al. | ............... | 327/18 |
| 6,377,082 | B1 | * | 4/2002 | Loinaz et al. | ................ | 327/20 |
| 6,545,508 | B2 | * | 4/2003 | Senba | .............. | 327/20 |
| 6,737,892 | B2 | * | 5/2004 | Jong et al. | ........... | 327/18 |
| 7,868,662 | B2 | * | 1/2011 | Kinugasa et al. | ............... | 327/34 |
| 2010/0171528 | A1 | * | 7/2010 | Guillot et al. | ................ | 327/20 |

FOREIGN PATENT DOCUMENTS

| JP | 10-240374 A | 9/1998 |
| JP | 2008-191924 A | 8/2008 |

* cited by examiner

*Primary Examiner* — Tuan T Lam
(74) *Attorney, Agent, or Firm* — Holtz, Holtz, Goodman & Chick, PC

(57) ABSTRACT

A clock diagnosis circuit includes: a delay circuit to delay the clock by a prescribed time which is not more than the clock pulse width; an integral multiplication delay circuit to delay a delayed clock outputted from the delay circuit by a prescribed number of cycles; a first exclusive OR circuit to encode the clock using the delayed clock; a second exclusive OR circuit to decode an output of the first exclusive OR circuit using an output of the integral multiplication delay circuit; and a comparison circuit to compare the clock with an output of the second exclusive OR circuit to thereby detect a malfunction of the clock.

8 Claims, 8 Drawing Sheets

(12) United States Patent
US 8,717,066 B2

CLOCK DIAGNOSIS CIRCUIT

CROSS-REFERENCE TO RELATED APPLICATION

This application is based upon and claims the benefit of priority from the prior Japanese Patent Application No. 2011-215708, filed on Sep. 29, 2011, the entire contents of which are incorporated herein by reference.

FIELD

Embodiments of the present invention relate to a clock diagnosis circuit which diagnoses a malfunction of a clock cycle and a clock pulse width of a clock used as a synchronization signal for a system or a circuit.

BACKGROUND

For manufacturers and suppliers of apparatuses, as a functional safety standard of international standard, IEC61508 standard "Functional safety of electrical/electronic/programmable electronic safety-related systems" of International Electrotechnical Commission is established.

With respect to a functional safety system for specific industrial use, a derivative standard adapted for specific use is established. For example, with respect to a safety instrumentation system, Process Application Standard IEC61511 is established for a designer, an integrator, and a user of a system.

In these standards, safety in the life cycle of a system from design, maintenance to disposition is assessed, and Safety Integrity Level (SIL) that is a required level for risk reduction is established as a quantitative assessment measure.

From the background like this, in a safety instrumentation system, there is a request for clock diagnosis in order to improve the safety and reliability of the system. That is, in order to prevent the system from becoming in an abnormal state caused by the malfunction of a circuit which is operated by a clock, such as a CPU and a FPGA used in a controller, there is a request for diagnosis for the clock to be used.

The malfunction of a clock is caused by a random failure of a clock oscillator circuit, a voltage variation of a power source to supply power to a clock circuit, the change in ambient temperature of the clock circuit, and so on. For this reason, it is necessary to monitor the clock during the system operation and detect an abnormal clock.

Generally, a method to detect the malfunction of a clock by comparing two clock signals (Refer to JP, P2008-191924A, for example.), and a method in which a clock signal is delayed by one clock cycle and the waveform of the clock signal at a preceding clock cycle and the waveform of the present clock signal are compared (Refer to JP, P1998-240374A, for example.) are known.

In the above-described JP, P2008-191924A, in order to diagnose clocks in two redundant systems, clocks in the two systems are compared to thereby diagnose the malfunction of the clocks. Since two clocks are required in this method, it can not be applied to a system in which only a single clock signal is used.

In the above-described JP, P1998-240374A, a clock signal is delayed by one clock cycle, and the waveform of the clock signal at a preceding clock cycle and the waveform of the present clock signal are compared. For this reason, the malfunction can be detected if the variation in the clock cycle and clock pulse width is large during two consecutive clock cycles. But in the case of a slow variation which occurs with a period not less than two clock cycles, this method can not detect such a malfunction.

For example, when the variation during the adjacent clock cycles is sparse and the variation accumulates gradually, it is difficult to detect such a malfunction. Here, such a malfunction is called "a cumulative variation in a clock".

DETAILED DESCRIPTION

A clock diagnosis circuit according to an embodiment includes: a delay circuit to delay the clock by a prescribed time which is not more than the clock pulse width; an integral multiplication delay circuit to delay a delayed clock outputted from the delay circuit by a prescribed number of cycles; a first exclusive OR circuit to encode the clock using the delayed clock; a second exclusive OR circuit to decode an output of the first exclusive OR circuit using an output of the integral multiplication delay circuit; and a comparison circuit to compare the clock with an output of the second exclusive OR circuit to thereby detect a malfunction of the clock.

Hereinafter, embodiments of the present invention will be described with reference to the drawings.

First Embodiment

A first embodiment will be described with reference to FIG. 1A to FIG. 7. To begin with, the configuration of a clock diagnosis circuit will be described with reference to FIG. 1A and FIG. 1B.

Figure 1A:
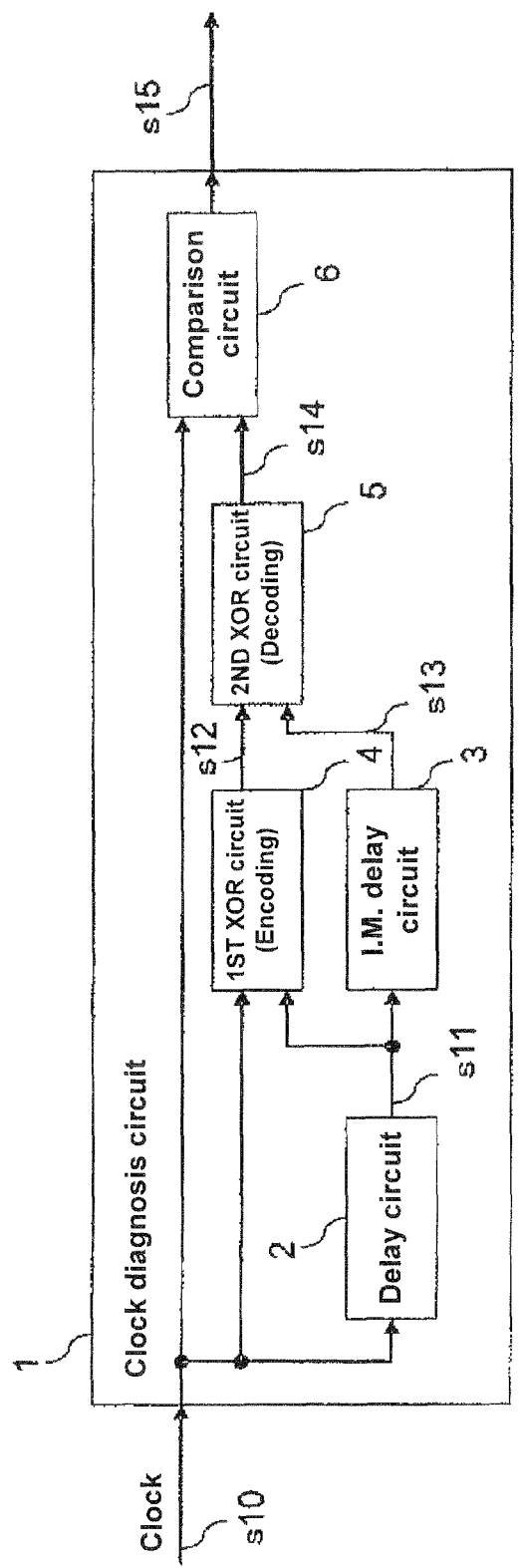
FIG. 1A and FIG. 1B show a configuration diagram of a first embodiment and a time chart thereof, respectively.

FIG. 1A shows a clock signal diagnosis circuit 1 which detects a malfunction of a clock cycle $T_i$ and a clock pulse width Pw of a clock s10 based on the single clock s10. In addition, the duty ratio ($=Pw/T_i$) of the clock pulse is 50%.

In FIG. 1A, the clock diagnosis circuit 1 is provided with a delay circuit 2, a first exclusive OR circuit 4, an integral multiplication delay circuit 3, a second exclusive OR circuit 5, and a comparison circuit 6. The delay circuit 2 delays the clock s10 by a prescribed delay time Δtd which is not more than the clock pulse width thereof. The first exclusive OR circuit 4 encodes the clock s10 using a delayed clock s11 outputted from the delay circuit 2. The integral multiplication delay circuit 3 delays the delayed clock s11 by a prescribed number of cycles. The second exclusive OR circuit 5 decodes an output s12 of the first exclusive OR circuit 4 using an output s13 of the integral multiplication delay circuit 3. The comparison circuit 6 compares the clock s10 with an output of the second exclusive OR circuit 5 to thereby detect a malfunction of the clock s10.

Each portion of the clock diagnosis circuit 1 configured like this make a response in a time shorter than the delay time Δtd. In addition, the pulse width of the inputted clock s10 is broader than the delay time Δtd.

Figure 1B:
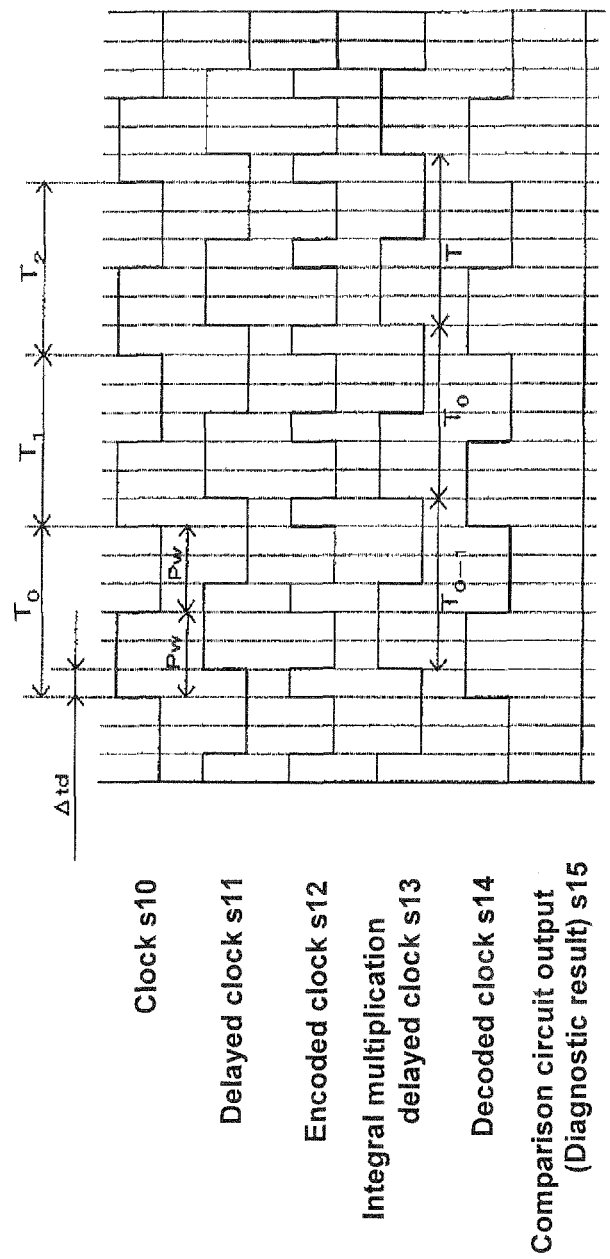

Next, in FIG. 1B, an operation of the clock diagnosis circuit 1 configured like this is shown in a time chart. FIG. 1B shows an operation when there is no malfunction in the clock cycle Ti and the clock pulse width Pw. The clock s10 is encoded by the first exclusive OR circuit 4 using the delayed clock s11 to thereby become the encoded clock s12. The encoded clock s12 is decoded by the second exclusive OR circuit 5 using the integral multiplication delayed clock s13 delayed by one cycle to thereby become a decoded clock s14. The clock s10 is compared with the decoded clock s14 in the comparison circuit 6 to thereby determine the malfunction of the clock s10.

Figure 2A:
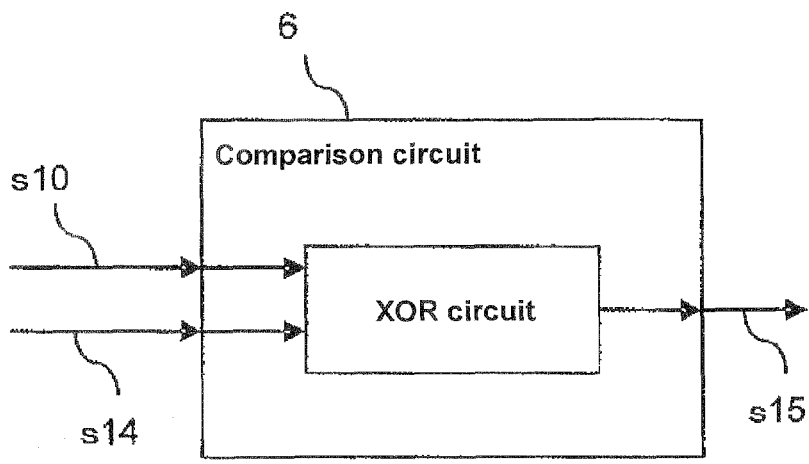
FIG. 2A and FIG. 2B show a detailed configuration diagram of a comparison circuit and a time chart thereof, respectively.

Next, the configuration of the comparison circuit 6 will be described. As shown in FIG. 2A, the comparison circuit 6 is composed of one exclusive OR circuit.

Figure 2B:
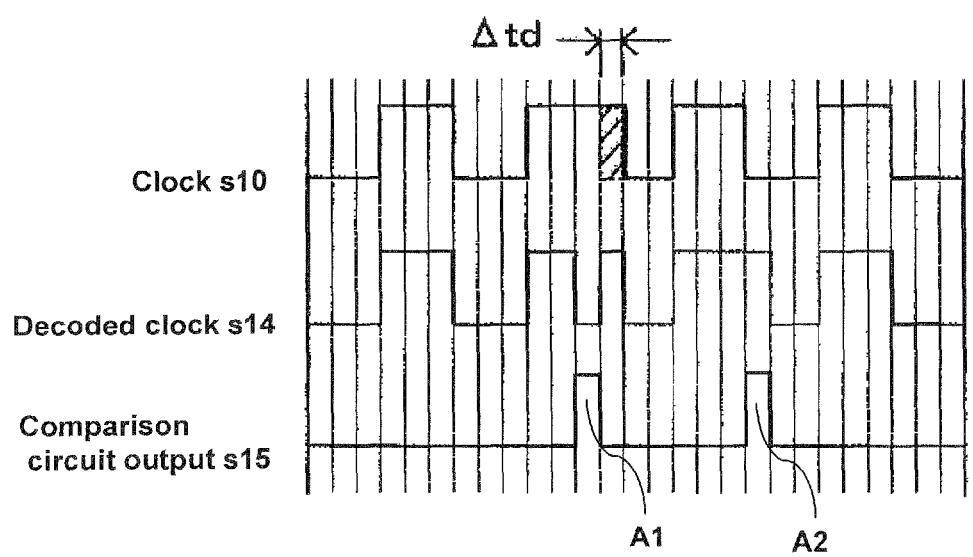

As shown in FIG. 2B, in case that the clock pulse width of the clock s10 has a single-shot expansion corresponding to the delay time (Δtd), the comparison circuit 6 outputs a comparison circuit output s15 including pulses A1, A2 each of which indicates the malfunction.

Figure 3A:
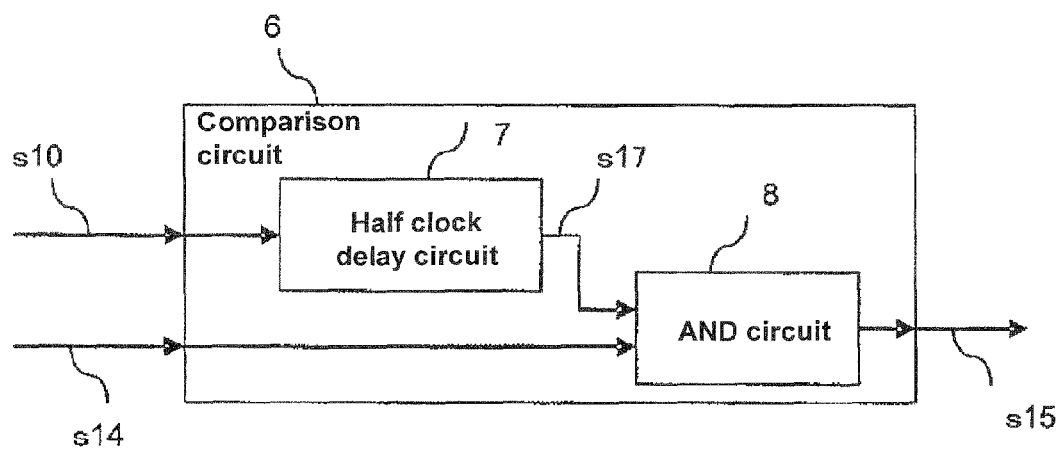
FIG. 3A and FIG. 3B show a detailed configuration diagram of a comparison circuit and a time chart thereof, respectively.

In addition, as shown in FIG. 3A, the comparison circuit 6 may be composed of a half clock delay circuit 7 and an AND circuit 8. The half clock delay circuit 7 delays the clock s10 by a half clock cycle. The AND circuit 8 obtains a logical AND of an output s17 of the half clock delay circuit 7 and the decoded clock s14.

Figure 3B:
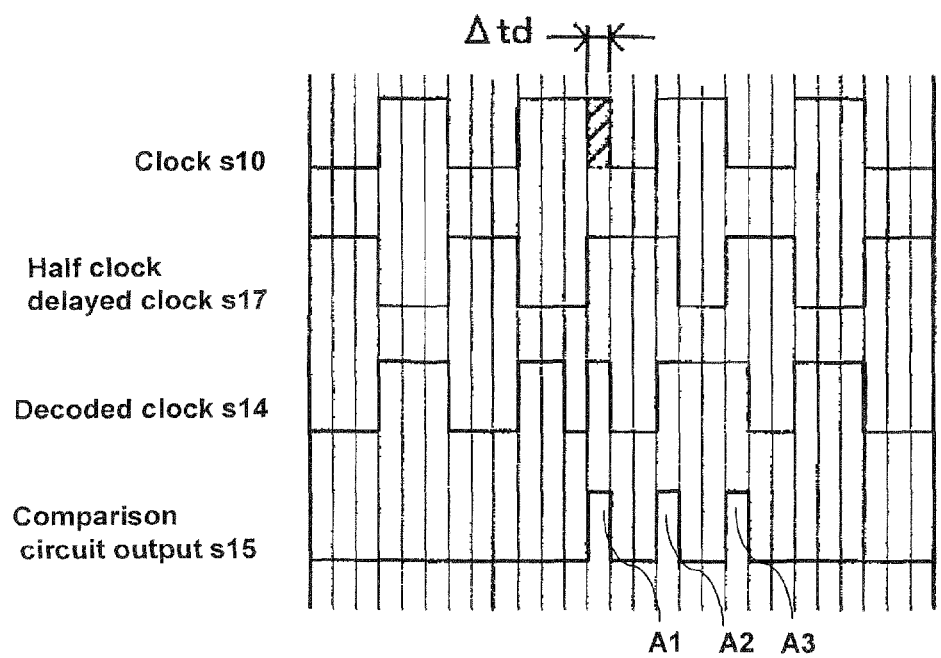

In case that the clock pulse width of the clock s10 has a single-shot expansion corresponding to the delay time (Δtd), for example, the comparison circuit 6 outputs the comparison circuit output s15 including pulses A1, A2, A3 each of which indicates the malfunction as shown in FIG. 3B.

Next, an operation example of the malfunction detection of the clock diagnosis circuit 1 configured like this will be described with reference to time charts of FIG. 4 to FIG. 7. In addition, the clock diagnosis circuit 1 uses the comparison circuit 6 shown in FIG. 2A.

As explained with reference to FIG. 1A and FIG. 1B, in the malfunction determination of the clock s10, the clock itself to be diagnosed is encoded with the delayed clock s11 which is delayed by the delay time Δtd, and the encoded clock s12 is decoded with the decoding clock s13 which is delayed by a clock cycle, for example. And the decoded clock s14 which has been decoded and the inputted clock s10 are compared to determine the malfunction.

Figure 4:
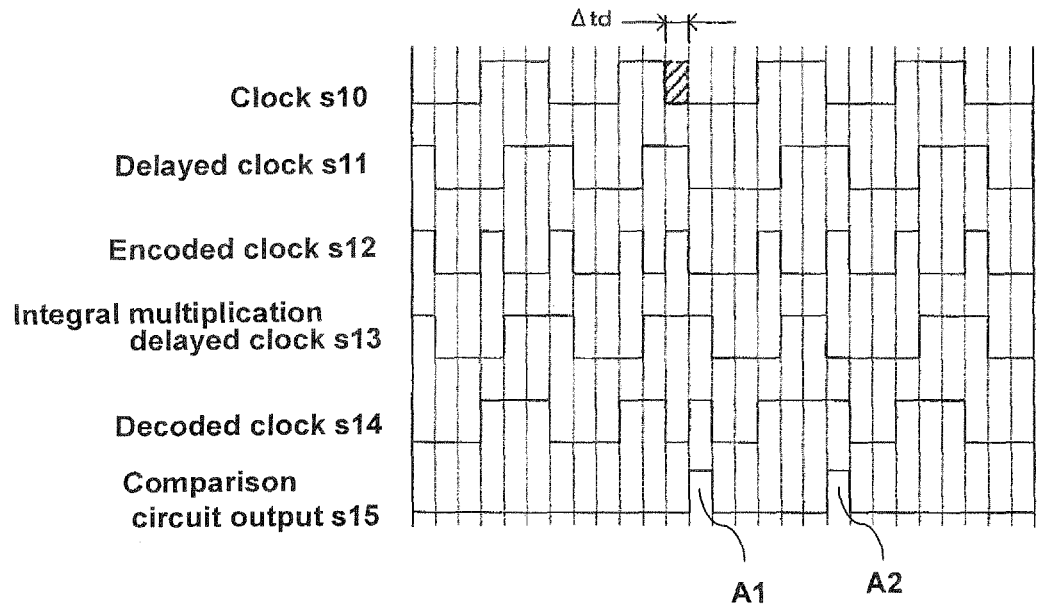
FIG. 4 shows a time chart when a pulse width of a clock pulse decreases.

FIG. 4 shows a malfunction detection operation in case that the clock cycle Ti of the clock s10 does not vary but the clock pulse width Pw decreases in a single-shot manner. In this case, the comparison circuit 6 outputs the comparator circuit output s15 including the two pulses A1, A2 each of which indicates the malfunction.

Figure 5:
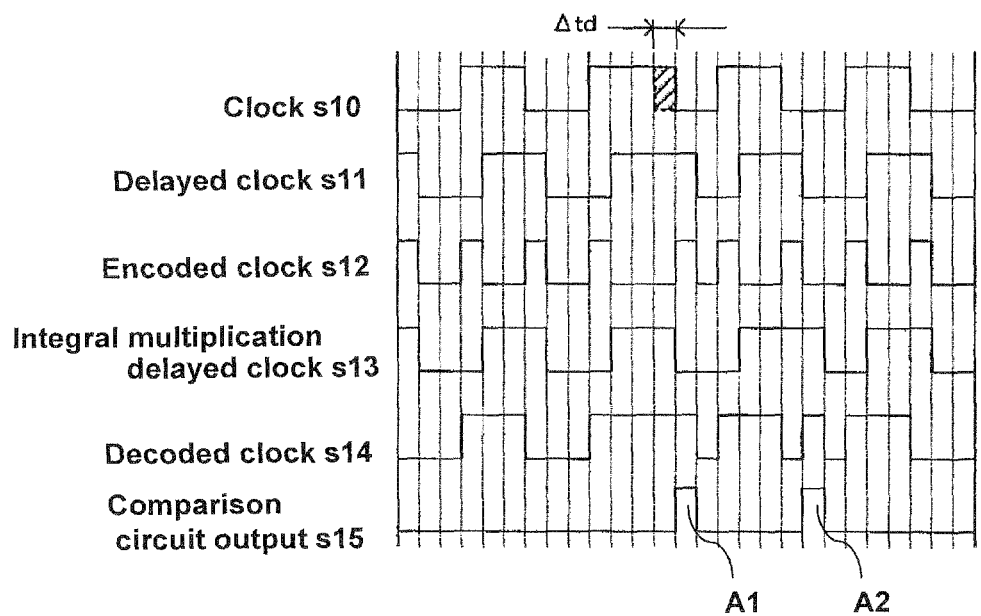
FIG. 5 shows a time chart when a pulse width of a clock pulse increases.

FIG. 5 shows a malfunction detection operation in case that the clock cycle Ti of the clock s10 does not vary but the clock pulse width Pw increases in a single-shot manner. In this case too, the comparison circuit 6 outputs the comparator circuit output s15 including the two pulses A1, A2 each of which indicates the malfunction.

Figure 6:
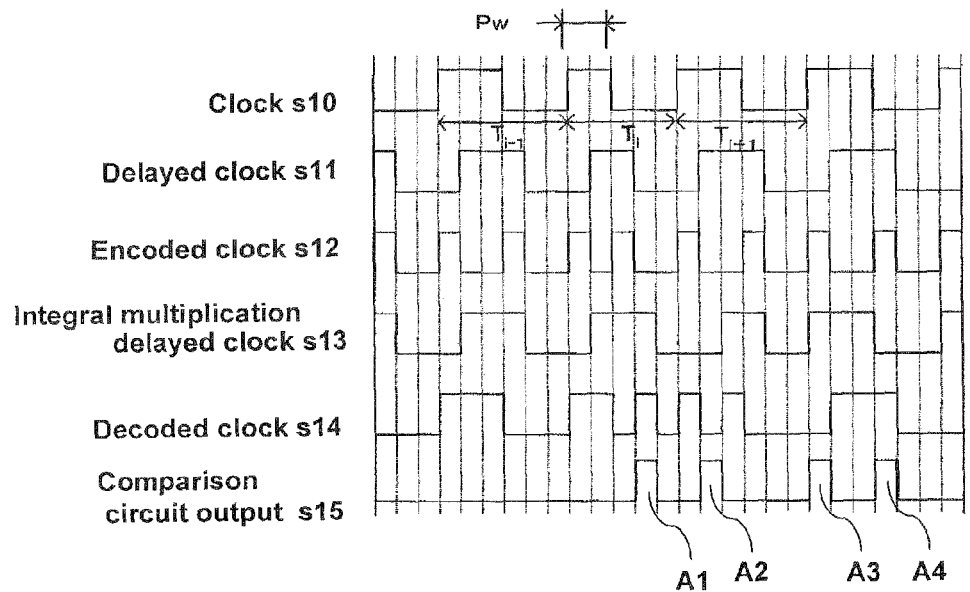
FIG. 6 shows a time chart when a clock cycle of a clock pulse changes in a single-shot manner.

Next, FIG. 6 shows a malfunction detection operation in case that the duty ratio of the clock s10 changes in a single-shot manner and both the clock cycle Ti and the clock pulse width Pwi decrease.

In this case, as shown in the drawing, the comparison circuit 6 outputs the comparator circuit output s15 including the pulses A1, A2, A3, A4 each of which indicates the malfunction.

Figure 7:
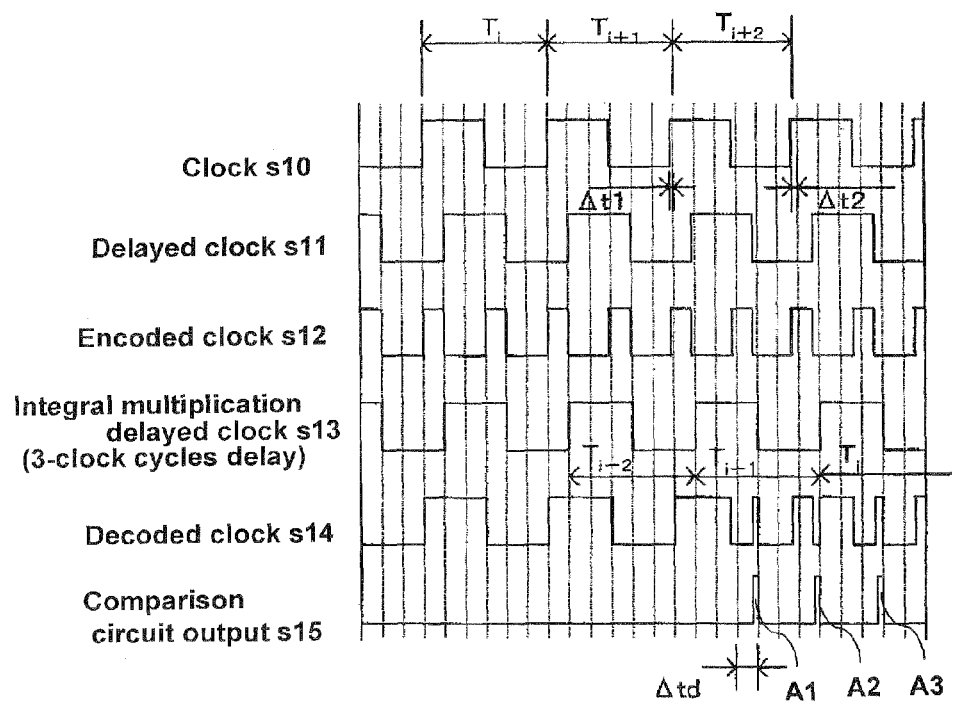
FIG. 7 shows a time chart when a clock cycle cumulatively varies.

Next, a malfunction detection operation will be described with reference to FIG. 7 in case that the clock cycle Ti cumulatively varies gradually within not more than the delay time Δtd.

In this case, as the delay integer value of the integral multiplication delay circuit 3, a value is set corresponding to a time during which the detectable variation is generated. FIG. 7 shows the case in which the clock is delayed by three clock cycles.

The clock cycle with the default value Ti gradually increases by a pulse width not more than the delay time Δtd. The clock cycle gradually increases by Δt1, Δt2, ... Δtn, for example. As shown in FIG. 7, even if the variation of the clock cycle per cycle is not more than the delay time Δtd, the malfunction can be detected by the time resolution of the circuit system of the clock diagnosis circuit 1. Since the second exclusive OR circuit 5 can decode the clock in which the variation is accumulated, the comparison circuit 6 can detect the variation in the clock cycle more easily. In FIG. 7, the comparison circuit 6 outputs the comparison circuit output s15 including the pulses A1, A2, A3 each of which indicates the malfunction.

Generally, there is a request to make the detection limit of malfunction constant. In this case, a low pass filter circuit to remove a pulse of pulse width narrower than the pulse width corresponding to the delay time Δtd may be provided at the output of the comparison circuit 6. By this means, the low pass filter circuit can output only the pulses of pulse width not less than a definite width among the output pulses of the comparison circuit 6.

According to the configuration like this, the variation malfunction of the pulse width can be detected with a definite sensibility by the integral multiplication delay circuit and the low pass filter circuit.

As described above, according to the present embodiment, it is possible to provide a clock diagnosis circuit which can surely detect a malfunction of the variation in a clock cycle and a clock pulse width from a single clock signal.

In addition, in the case of the system described in JP, P1998-240374A, since only the comparison of the clock and the output of the delay circuit which delays the clock is performed, in case that the variation in the pulse width is small, the variation in the malfunction detection ability might be generated. But according to the present embodiment, it is possible to provide a clock diagnosis circuit without the variation in the malfunction detection ability.

Second Embodiment

Figure 8:
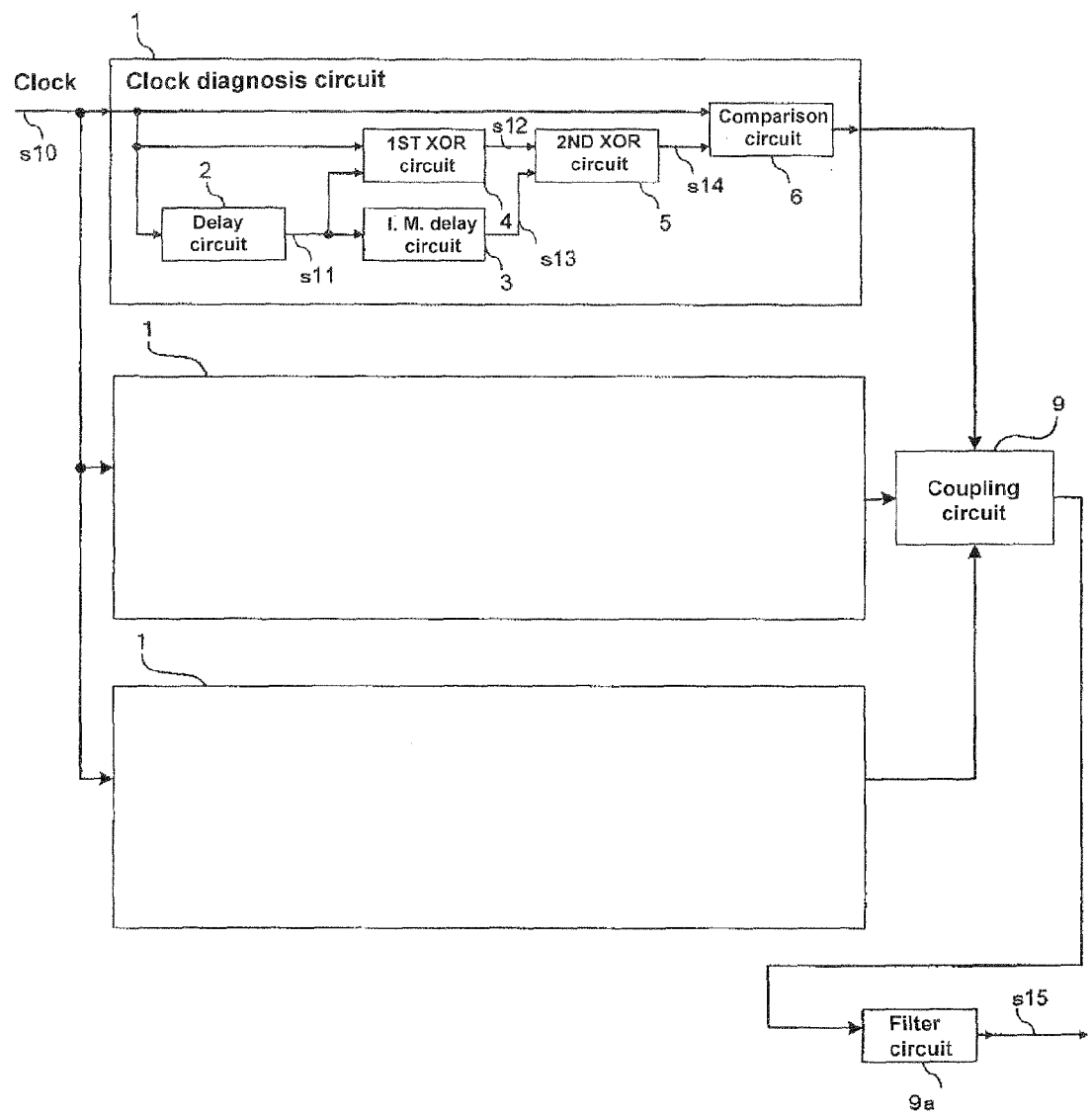
FIG. 8 shows a configuration diagram of a clock diagnosis circuit of a second embodiment.

A second embodiment will be described with reference to FIG. 8. With respect to each portion of the second embodiment, the same portions as in the clock diagnosis circuit of the first embodiment are shown by the same symbols, and their description will be omitted.

In the first embodiment, the integral multiplication delay circuit 3 to detect the cumulative variation in the click cycle can set one number of cycles. The second embodiment is provided with a plurality of the clock diagnosis circuits 1, and further provided with a coupling circuit 9 to obtain a logical OR of the respective outputs thereof and a filter circuit 9a to make the detection sensibility constant. The integral multiplication delay circuits 3 of the clock diagnosis circuits 1 can set the delay cycles different from each other and delay the delayed clocks by different values for the clock diagnosis circuits respectively.

According to the second embodiment, it is possible to surely detect a malfunction of the variation in a clock cycle and a clock pulse width from a single clock signal. In addition, according to the second embodiment, the variation during a plurality of the clock cycles can be detected, and the cumulative variation during the clock cycles can be quickly detected.

Third Embodiment

Figure 9:
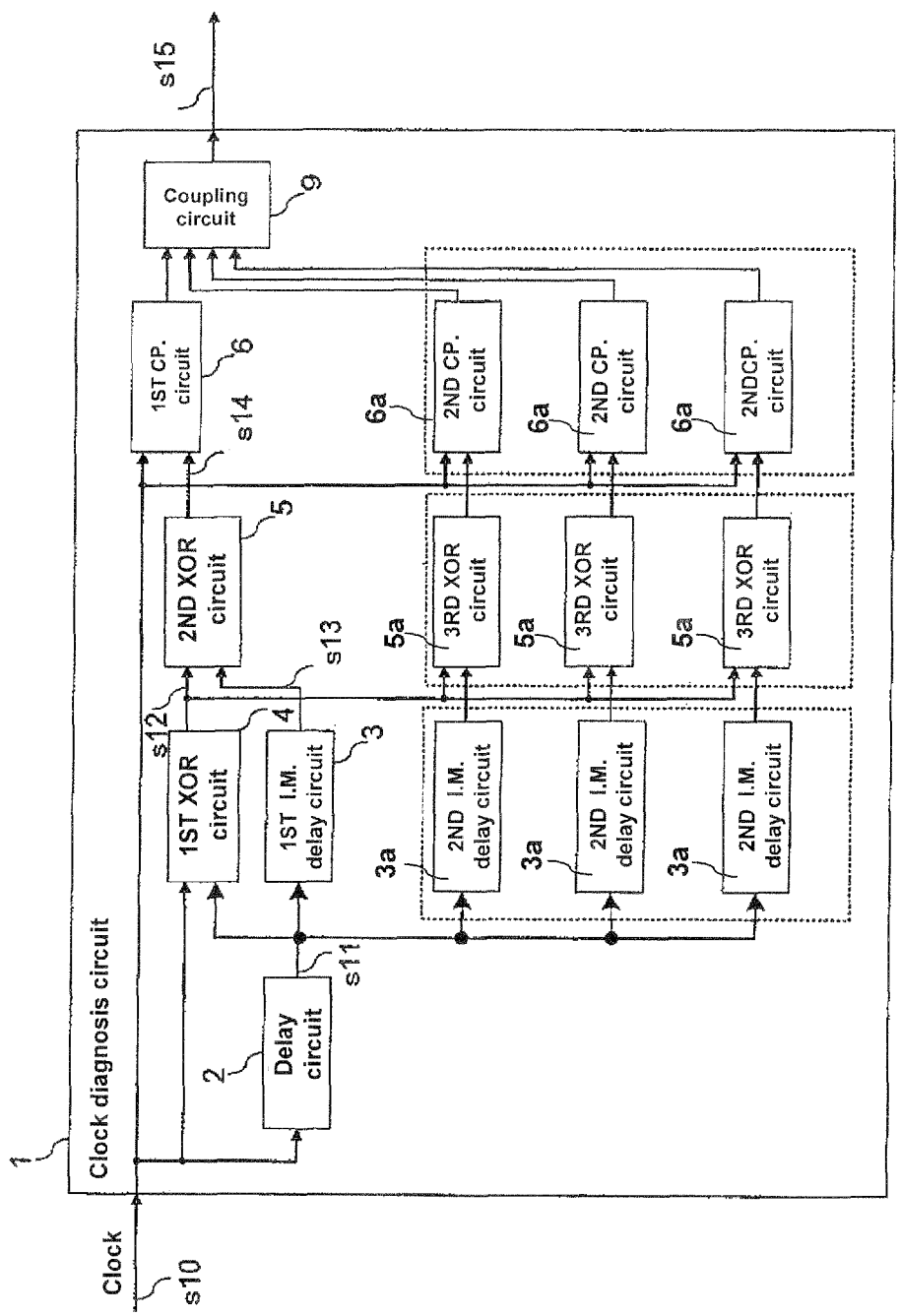
FIG. 9 shows a configuration diagram of a clock diagnosis circuit of a third embodiment.

A third embodiment will be described with reference to FIG. 9. With respect to each portion of the third embodiment, the same portions as in the clock diagnosis circuit of the second embodiment are shown by the same symbols, and their description will be omitted.

In order to form the configuration in which a plurality of delay cycles can be set, the second embodiment is provided with a plurality of the clock diagnosis circuits 1. The third embodiment is provided with a plurality of second integral multiplication delay circuits 3a, third exclusive OR circuits 5a, and second comparison circuits 6a. The numbers of delay cycles of the delayed signal s11 which the second integral multiplication delay circuits 3 delay differ from the number of the delayed cycles of the delayed signal s11 which the first integral multiplication delay circuit 3 delay. In addition, the numbers of delay cycles of the delayed signal s11 differ among the second integral multiplication delay circuits 3.

In addition, the outputs of the respective comparison circuits 6, 6a are inputted to the coupling circuit 9 to obtain a logical OR of the respective outputs thereof, and a low pass filter circuit not shown is provided at the output of the coupling circuit 9.

According to the third embodiment, it is possible to surely detect a malfunction of the variation in a clock cycle and a clock pulse width from a single clock signal. In addition, according to the third embodiment, the variation during a plurality of the clock cycles can be detected, and the cumulative variation during the clock cycles can be quickly detected. In addition, compared with the second embodiment, in the third embodiment, as the delay circuit 2 and the first exclusive OR circuit 4 just one respective circuits are required, and thereby the clock diagnosis circuit can be formed compactly.

While certain embodiments have been described, those embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A clock diagnosis circuit which detects a malfunction of variation in a clock cycle and a clock pulse width of a clock, the clock diagnosis circuit comprising:
    a delay circuit to delay the clock by a prescribed time which is not more than the clock pulse width;
    an integral multiplication delay circuit to delay a delayed clock outputted from the delay circuit by a prescribed number of cycles;
    a first exclusive OR circuit to encode the clock using the delayed clock;
    a second exclusive OR circuit to decode an output of the first exclusive OR circuit using an output of the integral multiplication delay circuit; and
    a comparison circuit to compare the clock with an output of the second exclusive OR circuit to thereby detect a malfunction of the clock.

2. The clock diagnosis circuit according to claim 1, further comprising a filter circuit connected to an output side of the comparison circuit.

3. The clock diagnosis circuit according to claim 1, wherein the comparison circuit includes an exclusive OR circuit to obtain an exclusive OR of the clock and the output of the second exclusive OR circuit.

4. The clock diagnosis circuit according to claim 1, wherein the comparison circuit includes a half clock delay circuit to delay the clock by a half cycle and an AND circuit to obtain a logical AND of an output of the half clock delay circuit and the output of the second exclusive OR circuit.

5. A clock signal diagnosis circuit comprising:
    a plurality of the clock diagnosis circuits according to claim 1; and
    a coupling circuit to obtain a logical OR of respective outputs of the clock diagnosis circuits;
    wherein the integral multiplication delay circuits of the clock diagnosis circuits delay the delayed clocks by different values for the clock diagnosis circuits respectively.

6. A clock diagnosis circuit which detects a malfunction of variation in a clock cycle and a clock pulse width of a clock, the clock diagnosis circuit comprising:
    a delay circuit to delay the clock by a prescribed time which is not less than a previously set clock pulse width;
    a first integral multiplication delay circuit to delay a delayed clock outputted from the delay circuit by a prescribed number of cycles;
    a first exclusive OR circuit to encode the clock using the delayed clock;
    a second exclusive OR circuit to decode an output of the first exclusive OR circuit using an output of the first integral multiplication delay circuit;
    a first comparison circuit to compare the clock with an output of the second exclusive OR circuit to thereby detect a malfunction of the clock;
    a plurality of second integral multiplication delay circuits each of which delays the delayed clock by a number of clock cycles different from each other and different from the prescribed number of cycles by which the first integral multiplication delay circuit delays the delayed clock;
    a plurality of third exclusive OR circuits which encode the output of the first exclusive OR circuit using respective outputs of the plurality of the second integral multiplication delay circuits;
    a plurality of second comparison circuits which compare the clock with respective outputs of a plurality of the third exclusive OR circuits; and
    a coupling circuit to obtain a logical OR of an output of the first comparison circuit and outputs of the plurality of the respective second comparison circuits.

7. The clock diagnosis circuit according to claim 5, further comprising a filter circuit at an output side of the coupling circuit.

8. The clock diagnosis circuit according to claim 6, further comprising a filter circuit at an output side of the coupling circuit.

\* \* \* \* \*